United States Patent [19]

Kominami et al.

[11] Patent Number: 4,473,852
[45] Date of Patent: Sep. 25, 1984

[54] NOISE REDUCTION SYSTEM

[75] Inventors: Yasuo Kominami; Kazuo Watanabe, both of Takasaki; Fumihiko Yokogawa, Tokorozawa; Nobuhiro Suzuki, Sayama, all of Japan

[73] Assignees: Hitachi, Ltd.; Pioneer Electronic Corporation, both of Tokyo, Japan

[21] Appl. No.: 412,001

[22] Filed: Aug. 27, 1982

[30] Foreign Application Priority Data

Aug. 28, 1981 [JP] Japan .................. 56-134004

[51] Int. Cl.$^3$ .......................... G11B 5/47; G11B 5/02
[52] U.S. Cl. .................... 360/66; 330/295; 360/68
[58] Field of Search .................. 360/65, 68, 25, 66; 307/264; 330/278, 295, 311

[56] References Cited

U.S. PATENT DOCUMENTS 4,370,681 1/1983 Akagiri .................. 360/65

Primary Examiner—Vincent P. Canney
Attorney, Agent, or Firm—Antonelli, Terry 7 Wands

[57] ABSTRACT

Conventional Dolby B-type or C-type noise reduction systems respond sensitively to an A.C. bias signal during recording onto a magnetic tape. As a result, the system might exhibit a large encode error. In order to reduce such encode error, the gain - frequency characteristic control sensitivity of a side chain in the system to the A.C. bias signal to be supplied to a recording head is set at a value smaller than that of the gain - frequency characteristic control sensitivity of the side chain to an encode input signal at an audio frequency. Such a reduction of the encode error is achieved by connecting a bias trap circuit to a gain control amplifier included in the side chain.

6 Claims, 10 Drawing Figures

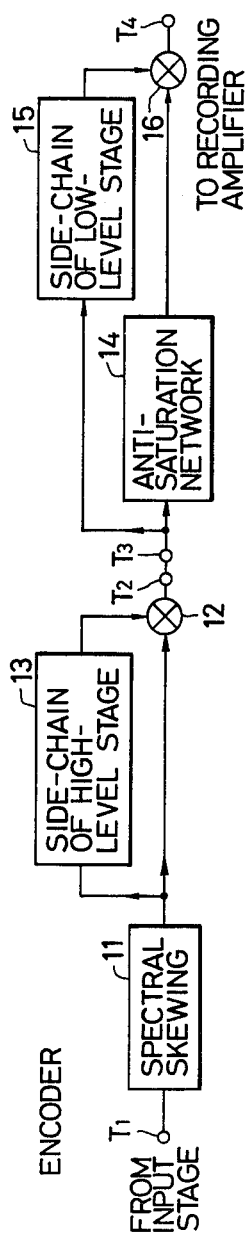
FIG. 1 *(PRIOR ART)*
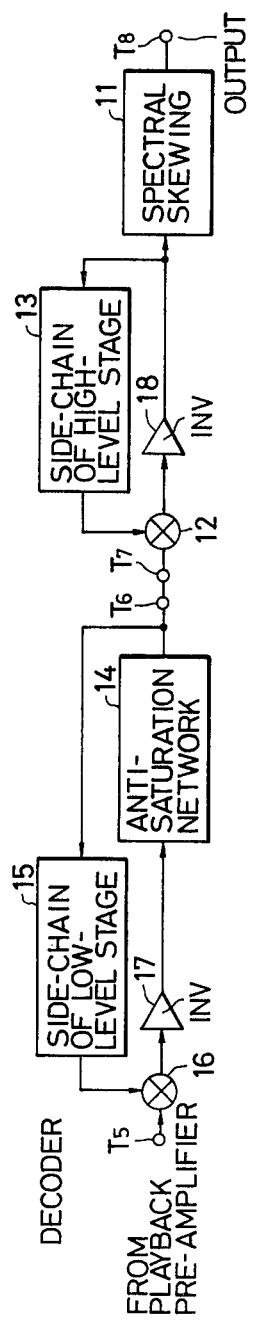
FIG. 2 *(PRIOR ART)*

NOISE REDUCTION SYSTEM

BACKGROUND OF THE INVENTION

The present invention relates to a noise reduction system.

It has heretofore been known that, in order to improve the S/N (signal-to-noise) ratio of certain specified transmission systems or specified recording/playback systems, a noise reduction system including a signal compressor and a signal expander is used for the system.

In particular, a noise reduction system wherein the circuit constituent parts of a signal compressor and those of a signal expander are shared and wherein the function of the signal compressor and that of the signal expander can be changed-over by transferring a mode switch has been proposed in the "Journal of the Society of Electronic and Radio Technicians", Vol. 8, May/-June 1974. The switchable signal compressor/signal expander of this type is well known in those in the art as the "Dolby B-type Noise Reduction System" (the word "Dolby" is a registered trademark of Dolbey Laboratories).

By changing-over the Dolby B-type noise reduction system to the signal compressor, this system becomes an encoder. The signal compressor (encoder) compresses the dynamic range of an input signal before this input signal is recorded on a recording tape. By changing-over the system to the signal expander, this system becomes a decoder. The signal expander (decoder) restores the linearity of the dynamic range for the input signal. The amount of noise is introduced in a recording/playback process is considerably reduced by this arrangement. Accordingly, the signal compressor/signal expander combination operates as a noise reduction system.

In the Dolby B-type noise reduction system, the operation of signal compression/signal expansion is usually performed for signal components whose frequencies are higher than the frequency value of 200 Hz.

The Dolby C-type noise reduction system has recently been developed on the basis of the Dolby B-type noise reduction system. Although the Dolby C-type system has a similar circuit arrangement to the B-type system, it differs greatly in its noise reduction effect. In particular, whereas the B-type exhibits a noise reduction level of approximately 10 dB at a frequency of 5 kHz, the C-type is improved to a noise reduction level of approximately 20 dB at the frequency of 5 kHz.

FIG. 1 shows circuit blocks for the well-known Dolby C-type noise reduction system when connected to operate as an encoder.

A recording input signal at an input terminal $T_1$ is applied to the input terminal of a spectral skewing network 11. In order to prevent a high-frequency gain from decreasing during a large-amplitude recording operation due to the characteristic of a tape, signal levels at frequencies of 10 kHz–20 kHz are reduced by the spectral skewing network 11. Thus, encode and decode errors at the specified frequencies of 10 kHz–20 kHz are remarkably reduced.

An output signal from the spectral skewing network 11 is applied to one input terminal of a combining network 12 and is also applied to the other input terminal of the combining network 12 through a high-level side chain 13, whereby an output signal from the combining circuit 12 is provided from a terminal $T_2$.

Thus, the signal path between the terminals $T_1$ and $T_2$ constructs the first level processing circuit of the Dolby C-type encoder. Further, a signal path extending between terminals $T_3$ and $T_4$ constructs the second level processing circuit of the Dolby C-type encoder.

When the terminals $T_2$ and $T_3$ are connected, the output signal of the combining circuit 12 is applied to an anti-saturation network 14 and a low-level side chain 15. The anti-saturation network 14 operates at a high signal level, thereby to prevent the saturation of the tape, high-frequency signal loss and an increase of the distortion factor.

Since an output signal from the anti-saturation network 14 and an output signal from the low-level side chain 15 are respectively applied to one input terminal and the other input terminal of a combining network 16, the encoded signal of the Dolby C-type encoder can be derived from the output terminal $T_4$ of the combining network 16.

The encoded output signal of the Dolby B-type encoder typically has amplitude-frequency characteristics such as those shown in FIG. 3. On the other hand, the output signal of the Dolby C-type encoder typically has amplitude-frequency characteristics such as those shown in FIG. 4. In comparing these two figures, it can be seen that as the signal amplitude level lowers, the amplitude value of the frequency component higher than 200 Hz contained in the encoded output signal of the Dolby C-type encoder becomes equal to about double that of the same frequency component contained in the encoded output signal of the Dolby B-type encoder.

FIG. 2 shows circuit blocks for the well-known Dolby C-type noise reduction system connected to operate as a decoder.

An input terminal $T_5$ has a playback input signal from a playback pre-amplifier applied thereto, and is connected to one input terminal of the combining network 16. An output signal from the combining network 16 is applied to the anti-saturation network 14 through a signal inverter 17. An output signal from the anti-saturation network 14 is supplied to a terminal $T_6$, and is also supplied to the other input terminal of the combining network 16 through the low-level side chain 15.

Thus, the signal path between the terminals $T_5$ and $T_6$ constructs the first level processing circuit of the Dolby C-type decoder. Since the combination of the signal inverter 17 and the combining network 16 executes the subtraction of the signals, signal components higher than 200 Hz in the amplitude-frequency characteristics of the output signal of the first level processing circuit come to have a smaller amplitude value gradually with the lowering of the signal level.

Further, a signal path extending between terminals $T_7$ and $T_8$ constructs the second level processing circuit of the Dolby C-type decoder. More specifically, when the terminals $T_6$ and $T_7$ are connected, the output signal of the anti-saturation network 14 is supplied to one input terminal of the combining network 12. An output signal from the combining network 12 is supplied to the input terminal of the spectral skewing network 11 through a signal inverter 18, and is further supplied to the other input terminal of the combining network 12 through the high-level side chain 13. Since the combination of the signal inverter 18 and the combining network 12 similarly executes the subtraction of the signals, signal components higher than 200 Hz in the amplitude-frequency characteristics of the output signal of the spectral skewing network 11 to be derived from the terminal $T_8$ come to have a smaller amplitude value gradually with the lowering of the signal level.

Thus, the overall characteristics of the signal path from the terminal $T_5$ to the terminal $T_8$ become inverse to the amplitude-frequency characteristics of FIG. 4.

FIG. 5 illustrates the noise reduction level owing to the noise reduction system based on the combination of the foregoing Dolby C-type encoder and Dolby C-type decoder, and the noise reduction level owing to the Dolby B-type noise reduction system.

Although Dolby B-type and C-type systems certainly do provide excellent noise reduction, some problems do exist. In particular, it is common practice that an audio signal is recorded onto a magnetic tape by superposing an A.C. bias signal of 60 kHz–100 kHz thereon. In this regard, the side chain of the known Dolby noise reduction system of the B-type or the C-type not only reponds to audio signal components of high frequencies, but also responds sensitively to the A.C. bias signal of 60 kHz–100 kHz. Therefore, the known noise reduction Dolby B-type and C-type systems involved comparatively large encode and decode errors.

SUMMARY OF THE INVENTION

It is accordingly, an object of the present invention to provide a noise reduction system in which encode errors attributed to an A.C. bias signal are reduced. To achieve this and other objects, an arrangement is provided to set a gain-frequency characteristic control sensitivity of a side chain of the system to the A.C. bias signal at a value smaller than that of a gain-frequency characteristic control sensitivity of the side chain to an encode input signal.

BRIEF DESCRIPTION OF THE DRAWINGS

FIG. 1 shows circuit blocks for a well-known Dolby C-type noise reduction system connected to operate as a C-type encoder;

FIG. 2 shows circuit blocks for the well-known Dolby C-type noise reduction system connected to operate as a decoder;

DESCRIPTION OF THE PREFERRED EMBODIMENTS

Hereunder, embodiments of the present invention will be described with reference to the drawings.

Figure 4:
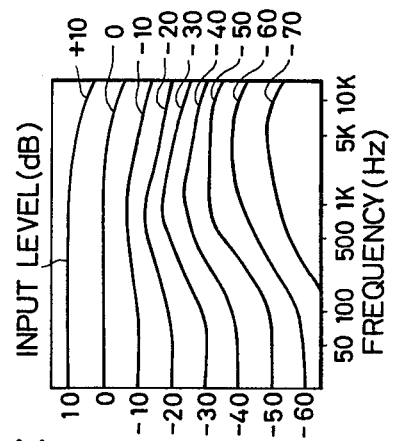
FIG. 4 shows the amplitude-frequency characteristics of the encoded output signal of the well-known Dolby C-type encoder.
Figure 3:
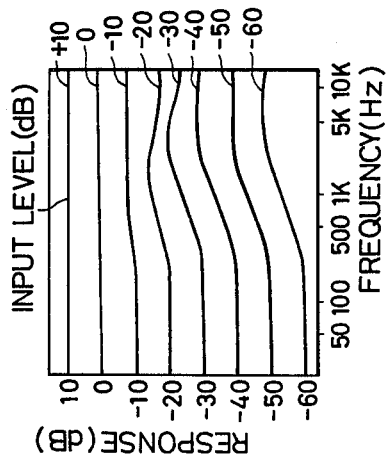
FIG. 3 shows the amplitude-frequency characteristics of the encoded output signal of a well-known Dolby B-type encoder.
Figure 5:
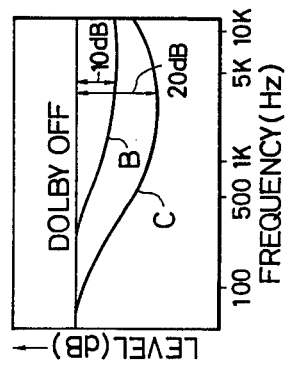
FIG. 5 shows the level of noise reduction by the noise reduction system based on the combination of the Dolby C-type encoder and the Dolby C-type decoder, and the level of noise reduction by a Dolby B-type noise reduction system.
Figure 6:
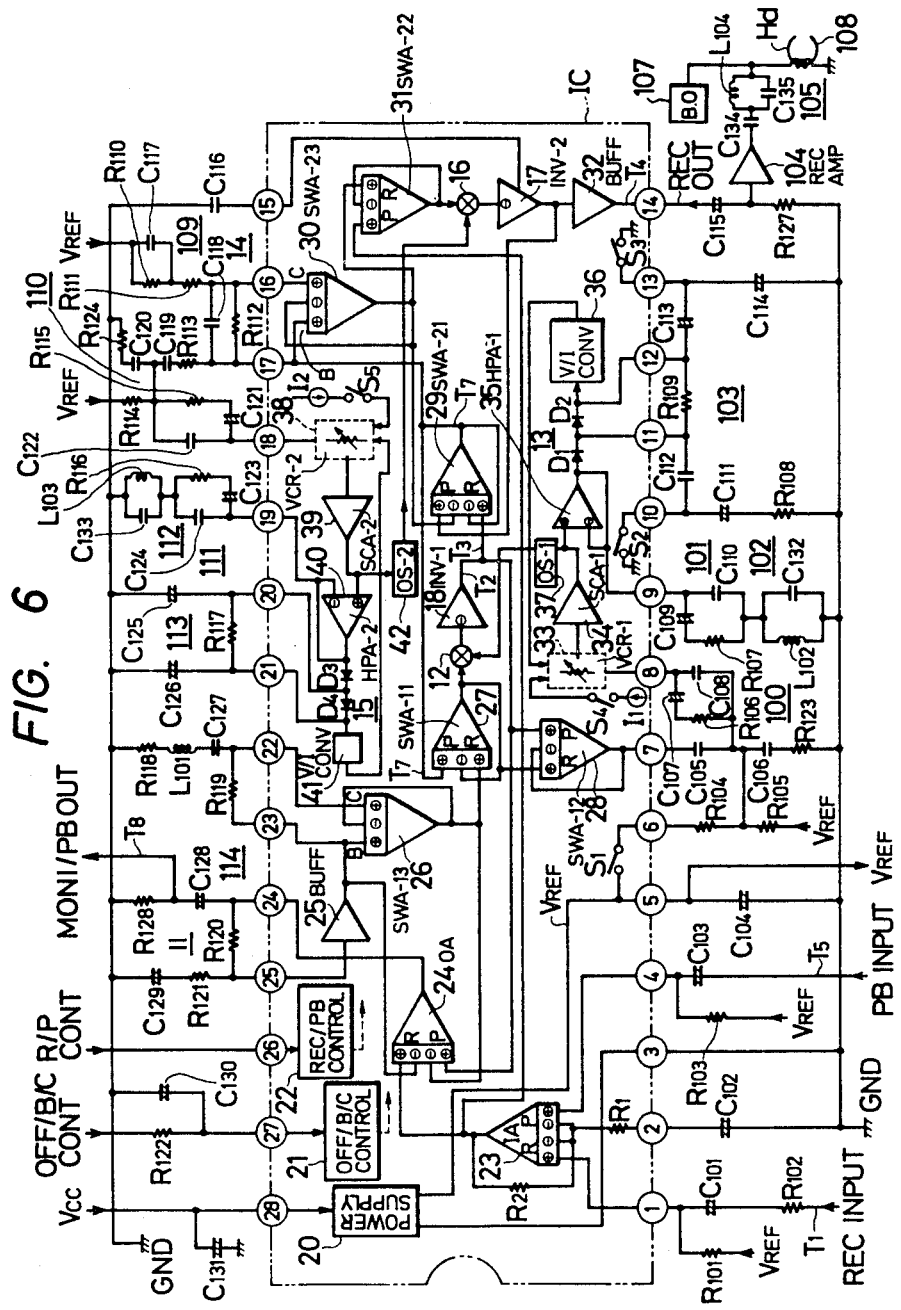
FIG. 6 shows a block diagram of a noise reduction system according to an embodiment of the present invention.

FIG. 6 shows a block diagram of a Dolby noise reduction system according to an embodiment of the present invention which can operate as either a B-type or a C-type system. Circuit elements inside a broken line IC are formed within a monolithic semiconductor integrated circuit (hereinbelow, termed "IC"), and numerals enclosed with circles indicate the external connecting terminals of the IC.

Terminal No. 1 of the IC is supplied with a bias voltage $V_{REF}$ through a resistor $R_{101}$, and is also supplied with an audio recording signal REC INPUT through a resistor $R_{102}$ as well as a capacitor $C_{101}$.

Terminal No. 2 of the IC is grounded through a capacitor $C_{102}$, and Terminal No. 3 thereof is conncted to the ground potential GND as a ground terminal.

Terminal No. 4 of the IC is supplied with the bias voltage $V_{REF}$ through a resistor $R_{103}$, and is also supplied with an audio playback signal PB INPUT through a capacitor $C_{103}$.

Terminal No. 5 of the IC is grounded through a capacitor $C_{104}$ for removing A.C. ripples, and the bias voltage $V_{REF}$ which is supplied to various circuit parts is generated from Terminal No. 5.

Terminal No. 6 of the IC is supplied with the bias voltage $V_{REF}$ through resistors $R_{104}$ and $R_{105}$.

Connected between Terminals No. 7 and No. 8 of the IC is a filter circuit network 100 which is constructed of capacitors $C_{105}$, $C_{106}$, $C_{107}$ and $C_{108}$ and resistors $R_{106}$ and $R_{123}$.

Terminal No. 9 of the IC is connected to a frequency characteristic determining circuit 101 which is constructed of capacitors $C_{109}$ and $C_{110}$ and a resistor $R_{107}$, and it is also connected to a bias trap circuit 102 which is especially constructed of an inductor $L_{102}$ and a capacitor $C_{132}$ in accordance with the present invention. The parallel resonance frequency of this bias trap circuit 102 is set to be substantially equal to the frequency of an A.C. bias signal which is generated by a bias oscillator 107 to be described later.

Terminals No. 10, No. 11, No. 12 and No. 13 of the IC are connected to a time constant circuit 103 which determines the rectifying characteristics of rectifying diodes $D_1$ and $D_2$ in the side chain of the noise reduction system. The time constant circuit 103 is constructed of capacitors $C_{111}$, $C_{112}$, $C_{113}$ and $C_{114}$ and resistors $R_{108}$ and $R_{109}$.

Terminal No. 14 of the IC is grounded through a capacitor $C_{115}$ as well as a resistor $R_{127}$, and the common node of the capacitor $C_{115}$ and the resistor $R_{127}$ is connected to the input terminal of a recording amplifier 104. The output terminal of the recording amplifier 104 is connected to a recording magnetic head 108 through an output coupling capacitor $C_{134}$ as well as a bias trap circuit 105. On the other hand, the A.C. bias signal generated from the bias oscillator 107 is supplied to the recording magnetic head 108. The bias trap circuit 105 is constructed of an inductor $L_{104}$ and a capacitor $C_{135}$, and the parallel resonance frequency thereof is determined to be substantially equal to the frequency of the A.C. bias signal which is generated by the bias oscillator 107.

Terminal No. 15 of the IC is grounded through a phase compensation capacitor $C_{116}$, whereby the A.C. operation of a signal inverter 17 in the IC is stabilized.

Terminals No. 16 and No. 17 of the IC are connected to a filter circuit 109 which is constructed of capacitors $C_{117}$ and $C_{118}$ and resistors $R_{110}$, $R_{111}$ and $R_{112}$, and which forms a part of an anti-saturation circuit 14.

Terminals No. 17 and No. 18 of the IC are connected to a filter circuit network 110 which is constructed of capacitors $C_{119}$, $C_{120}$, $C_{121}$ and $C_{122}$ and resistors $R_{114}$, $R_{115}$ and $R_{124}$.

Terminal No. 19 of the IC is connected to a frequency characteristic determining circuit 111 which is constructed of capacitors $C_{123}$ and $C_{124}$ and a resistor $R_{116}$, and it is then connected to a bias trap circuit 112 which is especially constructed of an inductor $L_{103}$ and a capacitor $C_{133}$ in accordance with the present invention. The parallel resonance frequency of this bias trap circuit 112 is determined to be substantially equal to the frequency of the A.C. bias signal which is generated by the bias oscillator 107.

Terminals No. 20 and No. 21 of the IC are connected to a time constant circuit 113 which determines the rectifying characteristics of rectifying diodes $D_3$ and $D_4$ in the side chain of the noise reduction system. The time constant circuit 113 is constructed of capacitors $C_{125}$ and $C_{126}$ and a resistor $R_{117}$.

Terminals No. 22, No. 23, No. 24 and No. 25 of the IC are connected to a filter circuit 114 which is constructed of capacitors $C_{127}$, $C_{128}$ and $C_{129}$, an inductor $L_{101}$, and resistors $R_{118}$, $R_{119}$, $R_{120}$, $R_{121}$ and $R_{128}$, and which forms a part of a spectral skewing network 11.

Terminal No. 26 of the IC has a recording/playback change-over control signal R/P CONT applied thereto.

Terminal No. 27 of the IC is connected to the ground potential through a capacitor $C_{130}$, and has a Dolby OFF/B/C change-over control signal OFF/B/C CONT applied thereto through a resistor $R_{122}$.

Terminal No. 28 of the IC is connected to the ground potential through a capacitor $C_{131}$, and is supplied with a power source voltage $V_{CC}$.

A power supplying circuit 20 is fed with the power source voltage $V_{CC}$ from Terminal No. 28, so that the bias voltage $V_{REF}$ (at a level of about $V_{CC}/2$) is generated at Terminal No. 5.

A Dolby OFF/B/C change-over control circuit 21 has the control signal OFF/B/C applied thereto from Terminal No. 27. Although specific connections are not shown for purposes of drawing simplification, this change-over control circuit 21 is coupled to the switches $S_1$, $S_2$, $S_3$, $S_4$ and $S_5$ to control their "on" and "off" states. This control connection is done in accordance with well-known switching principles, and the switches $S_1$ to $S_5$ themselves can be constructed of any conventional switch device suitable for implementation in or with an IC.

The OFF/B/C change-over control circuit 21 includes a tristate discriminator circuit (not shown in the drawings) for discriminating three voltage levels which are selectively supplied to the Terminal No. 27. The control signal OFF/B/C has three voltage levels. The first level represents selection of the "noise reduction OFF", the second level represents selection of the B-type noise reduction, and the third level represents selection of the C-type noise reduction. For example, the first level can be provided with a ground voltage or a low voltage near ground, the third level can be provided with a high voltage near the power source voltage, and the second level can be provided with a middle voltage between the voltages of the first and third levels.

When the control signal OFF/B/C becomes a first level, an output from the change-over control circuit 21 controls switches $S_4$ and $S_5$ into their "on" statees so that the high-level side chain 13 and low-level side chain 15 of the noise reduction system will stop their amplitude-frequency characteristic control operations. Simultaneously therewith, the output of the change-over control circuit 21 controls switches $S_1$, $S_2$ and $S_3$ into their "on" states.

When the control signal OFF/B/C becomes a second level, the output of the change-over control circuit 21 controls the switch $S_5$ into the "on" state so that the low-level side chain 15 of the noise reduction system will stop its amplitude-frequency characteristic control operaton so as to cause the noise reduction system of FIG. 6 to operate as a Dolby B-type system. Simultaneously therewith, the output of the change-over control circuit 21 controls the switches $S_1$, $S_2$ and $S_3$ into the "on" states and the switch $S_4$ into the "off" state. Thus, since the switch $S_4$ is in the "off" state, the high-level side chain 13 executes the amplitude-frequency characteristic control operation.

In addition to being coupled to switches $S_1$ to $S_5$, the control circuit 21 is also coupled to the switching amplifiers 26 and 30 to determine, in a known manner, which of their input terminals the amplifiers 26 and 30 will be responsive to (these connections are also not shown for drawing simplification). Accordingly, when the control signal OFF/B/C becomes the second level, the output of the change-over control circuit 21 controls switching amplifiers 26 and 30. As a result, the switching amplifiers 26 and 30 become responsive to input signals applied to the non-inverting input terminals ($\oplus$) of their B sides, and unresponsive to input signals applied to the non-inverting input terminals ($\oplus$) of their C sides.

When the control signal OFF/B/C becomes a third level, the output of the change-over control circuit 21 controls the switches $S_4$ and $S_5$ into the "off" states so that the high-level side chain 13 and low-level side chain 15 of the noise reduction system will execute their amplitude-frequency characteristic control operations to cause the FIG. 6 noise reduction system to operate as a Dolby C-type system. Simultaneously therewith, the output of the change-over control circuit 21 controls the switches $S_1$, $S_2$ and $S_3$ into the "off" states. Further, when the control signal OFF/B/C becomes the third level, the output of the change-over control circuit 21 controls the switching amplifiers 26 and 30, with the result that the switching amplifiers 26 and 30 become responsive to input signals applied to the non-inverting input terminals ($\oplus$) of their C sides and unresponsive to input signals applied to the non-inverting input terminals ($\oplus$) of their B sides.

A recording/playback chage-over control circuit 22 has the control signal R/P applied thereto from Terminal No. 26. This control circuit 22 is coupled to the switching amplifiers 23, 24 and 26 to 31 to determine, in a known manner, which of their input terminals these amplifiers will be responsive to (these connections are also not shown for drawing simplification).

The recording/playback change-over control circuit 22 includes a bi-state discriminator circuit (not shown in the drawings) for discriminating two voltage levels which are selectively supplied to the Terminal No. 26.

The control signal R/P has two voltage levels. The first level is provided to select an encoder operation and the second level is provided to select a decoder operation. For example, the first level can be provided with a high voltage near the power source voltage while the second level is provided with the ground or a low voltage near the ground voltage.

When the control signal R/P becomes a first level, a control signal is provided from the change-over control circuit 22 so that the noise reduction system may operate as an encoder. In this case, respective switching amplifiers operate as follows:

(1) Switching amplifiers 23, 24 and 29 become responsive to input signals respectively applied to the non-inverting input terminals (⊕) and inverting input terminals (⊖) of their R sides, and unresponsive to input signals respectively applied to the non-inverting input terminals (⊕) and inverting input terminals (⊖) of their P sides.

(2) Switching amplifiers 26, 27, 28, 30 and 31 become responsive to input signals applied to the non-inverting input terminals (⊕) of their R sides, and unresponsive to input signals applied to the non-inverting input terminals (⊖) of their P sides.

When the control signal R/P becomes a second level, a control signal is provided from the change-over control circuit 22 so that the noise reduction system may operate as a decoder. In this case, the respective switching amplifiers operate as follows:

(3) The switching amplifiers 23, 24 and 29 become responsive to input signals respectively applied to the non-inverting input terminals (⊕) and inverting input terminals (⊖) of their P sides, and unresponsive to input signals respectively applied to the non-inverting input terminals (⊕) and inverting input terminals (⊖) of their R sides.

(4) The switching amplifiers 26, 27, 28, 30 and 31 become responsive to input signals applied to the non-inverting input terminals (⊕) of their P sides, and unresponsive to input signals applied to the non-inverting input terminals of their R sides.

A variable impedance 33, a signal amplifier 34, a gain control amplifier 35, the rectifying diodes $D_1$ and $D_2$, a voltage-current converter 36, and an overshoot suppressor 37 constitute parts of the high-level side chain 13.

When a signal level which is transmitted to the variable impedance 33 through the filter circuit network 100 lowers, the signal amplifier 34, gain control amplifier 35, rectifying diodes $D_1$ and $D_2$ and voltage-current converter 36 (particularly, an output signal from the voltage-current converter 36) raise the impedance of the variable impedance 33 and increase the output signal of the signal amplifier 34 (the output signal of the high-level side chain 13) which is supplied to a combining network 12 through the overshoot suppressor 37.

When the switch $S_4$ falls into the "on" state, a predetermined control current flows from a constant current source $I_1$ into the variable impedance 33, with the result that the impedance of the variable impedance 33 lowers conspicuously. Then, the output signal of the signal amplifier 34 is no longer supplied to the combining network 12 through the overshoot suppressor 37, and the high-level side chain 13 stops its amplitude-frequency characteristic control operation.

A variable impedance 38, a signal amplifier 39, a gain control amplifier 40, the rectifying diodes $D_3$ and $D_4$, a voltage-current converter 41 and an overshoot suppressor 42 constitute parts of the low-level side chain 15.

When a signal level which is transmitted to the variable impedance 38 through the filter circuit network 110 lowers, the signal amplifier 39, gain control amplifier 40, rectifying diodes $D_3$ and $D_4$ and voltage-current converter 41 (particularly, an output signal from the voltage-current converter 41) raise the impedance of the variable impedance 38 and increase the output signal of the signal amplifier 39 (the output signal of the low-level side chain 15) which is supplied to a combining network 16 through the overshoot suppressor 42.

When the switch $S_5$ falls into the "on" state, a predetermined control current flows from a constant current source $I_2$ into the variable impedance 38, with the result that the impedance of the variable impedance 38 lowers conspicuously. Then, the output signal of the signal amplifier 39 is no longer supplied to the combining network 16 through the overshoot suppressor 42, and the low-level side chain 15 stops its amplitude-frequency characteristic control operation.

Figure 7:
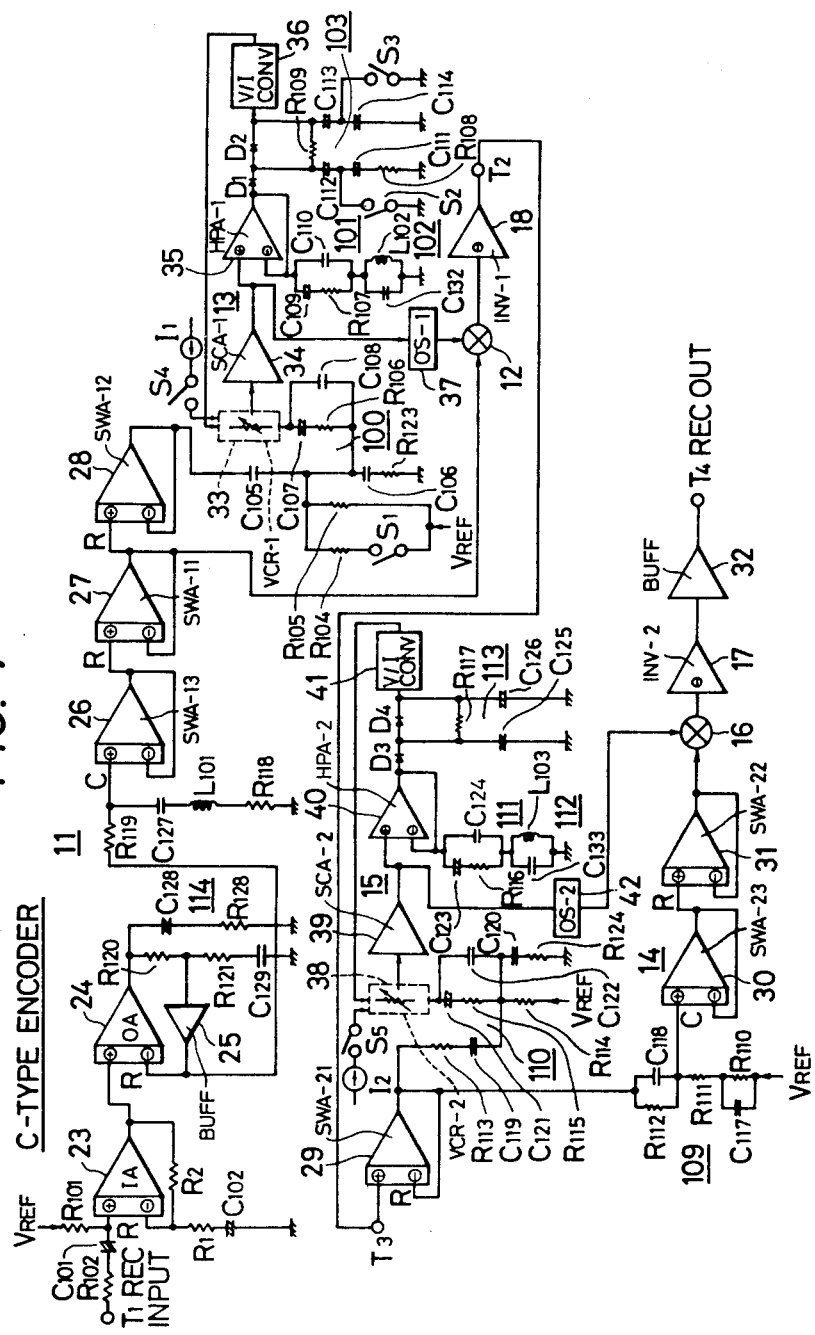
FIG. 7 is a circuit diagram showing signal transmission paths in the case where the noise reduction system of FIG. 6 operates as a Dolby C-type encoder.

FIG. 7 is a circuit diagram showing signal transmission paths in the case where the control signal OFF/B/C becomes the third level and the other control signal R/P becomes the first level, whereby the noise reduction system of FIG. 6 operates as a C-type encoder.

The signal transmission paths shown in FIG. 7 operate as the Dolby C-type encoder in FIG. 1. An encoded output signal (recording audio output signal) derived from a terminal $T_4$ in FIG. 7 is amplified by the recording amplifier 104 as shown in FIG. 6, and is thereafter applied to the recording head 108 through the bias trap 105. The recording head 108 has the A.C. bias signal of 60 kHz—100 kHz applied thereto from the bias oscillator 107. However, only the audio signal is recorded on a magnetic tape and substantially no A.C. bias signal is recorded owing to the frequency characteristic of the magnetic tape.

Figure 8:
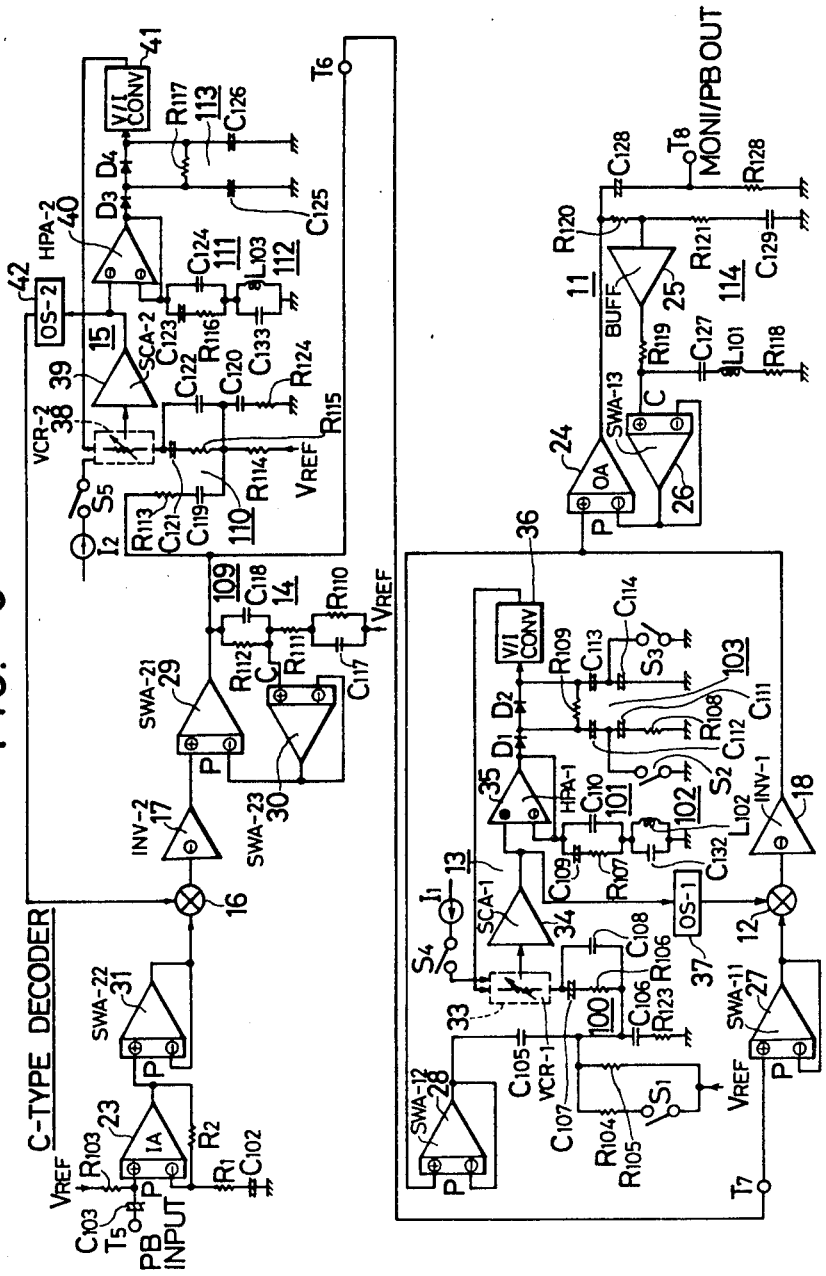
FIG. 8 is a circuit diagram showing signal transmission paths in the case where the noise reduction system of FIG. 6 operates as a Dolby C-type decoder.

FIG. 8 is a circuit diagram showing signal transmission paths in the case where the control signal OFF/B/C becomes the third level and the other control signal R/P becomes the second level, whereby the noise reduction system of FIG. 6 operates as a C-type decoder.

The signal transmission circuit shown in FIG. 8 operates as the Dolby C-type decoder in FIG. 2. The foregoing audio signal recorded on the magnetic tape by the recording head 108 is detected by a playback head (not shown), and is supplied to a terminal $T_5$ as a playback input signal PB INPUT through a playback equalizer (not shown).

Figure 9:
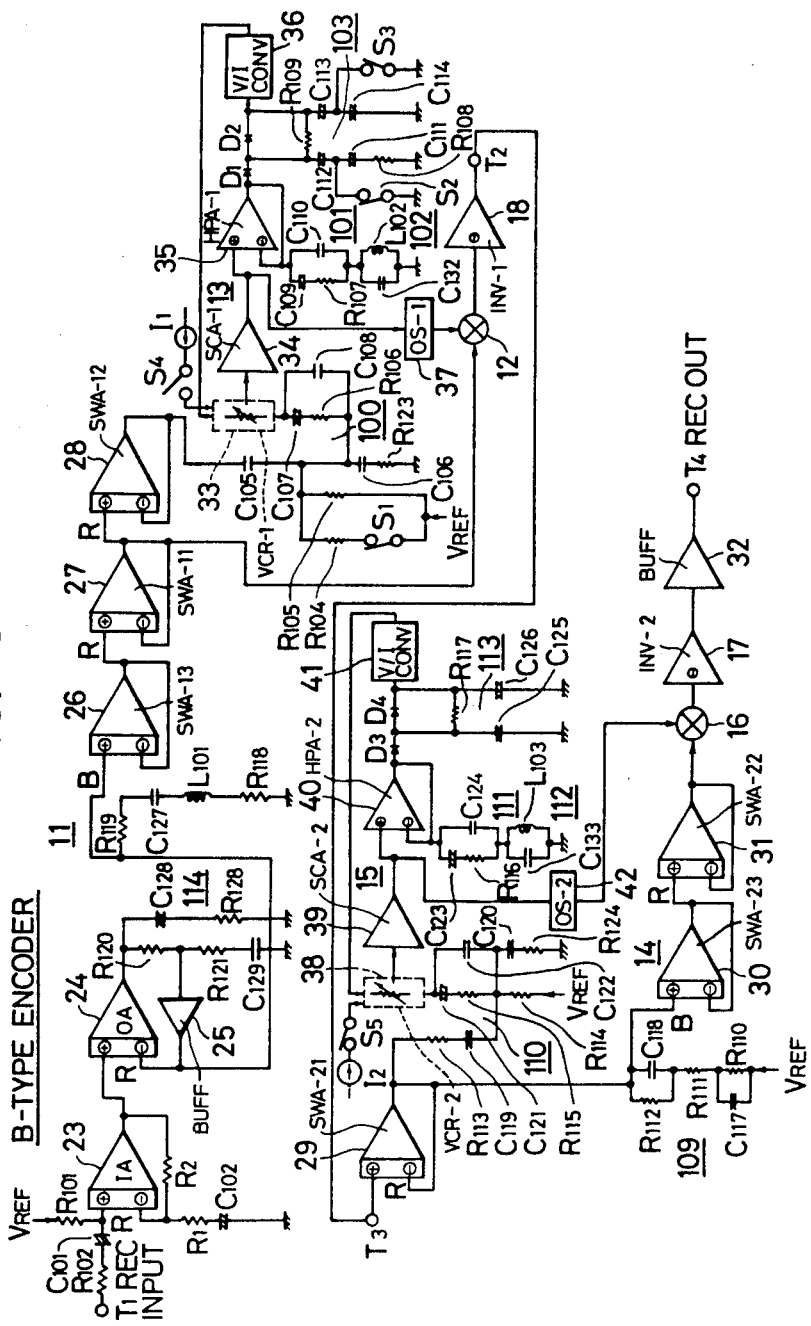
FIG. 9 is a circuit diagram showing signal transmission paths in the case where the noise reduction system of FIG. 6 operates as a Dolby B-type encoder.

FIG. 9 is a circuit diagram showing signal transmission paths in the case where the control signal OFF/B/C becomes the second level and the other control signal R/P becomes the first level, whereby the noise reduction system of FIG. 6 operates as a Dolby B-type encoder.

An encoded output signal (recording audio output signal) which is derived from a terminal $T_4$ of the signal transmission paths shown in FIG. 9 is amplified by the recording amplifier 104 as shown in FIG. 6, and is thereafter applied to the recording head 108 through the bias trap circuit 105. The recording head 108 has the A.C. bias signal of 60 kHz–100 kHz similarly applied thereto from the bias oscillator 107. Owing to the frequency characteristic of the magnetic tape, however, only the audio signal is recorded on the magnetic tape, and the A.C. bias signal is not recorded.

Figure 10:
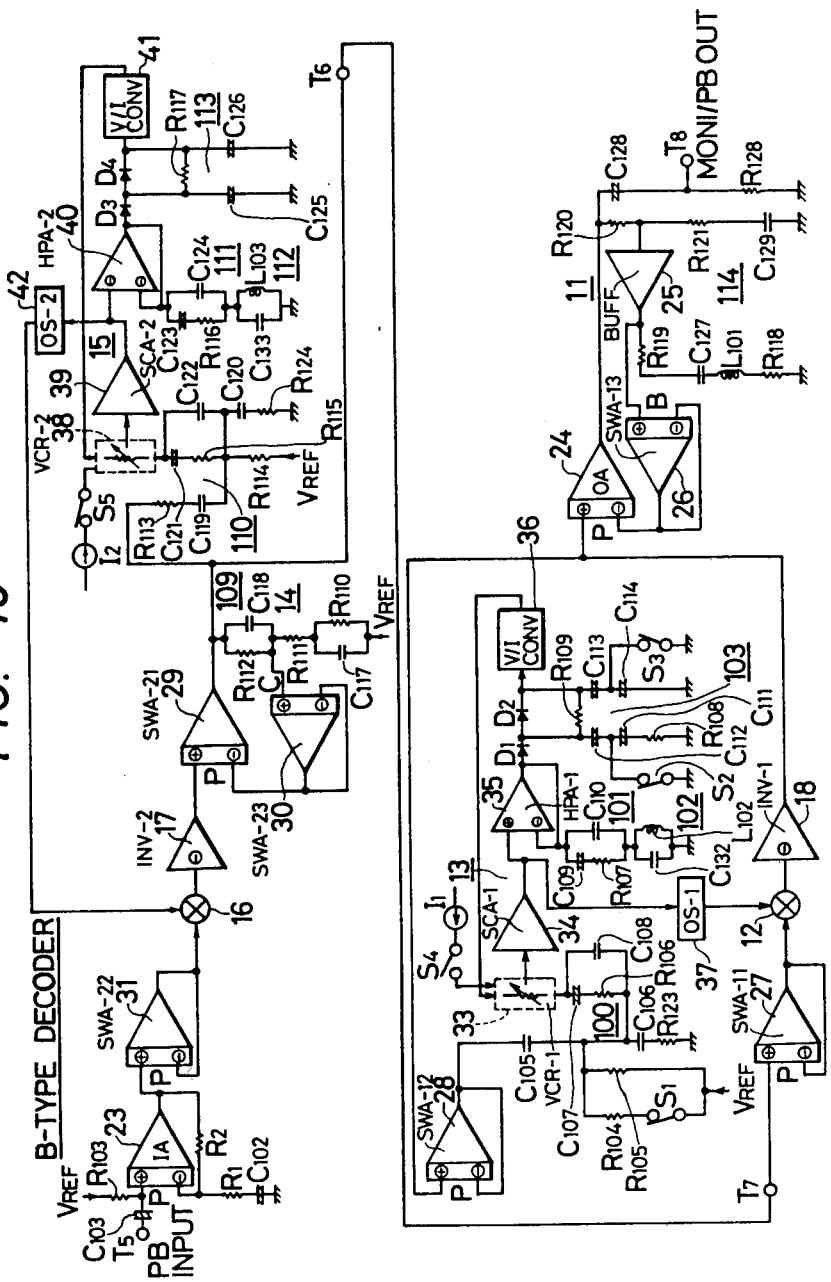
FIG. 10 is a circuit diagram showing signal transmission paths in the case where the noise reduction system of FIG. 6 operates as a Dolby B-type decoder.

FIG. 10 is a circuit diagram showing signal transmission paths in the case where the control signal OFF/B/C becomes the second level and the other control signal R/P becomes the second level, whereby the noise reduction system of FIG. 6 operates as a Dolby B-type decoder.

The signal transmission circuit shown in FIG. 10 operates as the Dolby B-type decoder. The foregoing audio signal recorded on the magnetic tape by the recording head 108 is detected by a playback head (not shown), and is supplied to a terminal $T_5$ as a playback input signal PB INPUT through a playback equalizer (not shown).

In the case where the noise reduction system of FIG. 6 operates as the decoder of the B-type or the C-type, the bias oscillator 107 stops its oscillation operation, with the result that the A.C. bias signal is not oscillated from the bias oscillator 107. In the case where the noise reduction system of FIG. 6 operates as the encoder of the B-type or the C-type, the bias oscillator 107 generates the A.C. bias signal of comparatively great voltage amplitude (100 $V_{p-p}$).

On the other hand, in the case where the noise reduction system operates as the B-type encoder, the variable impedance 33 of the high-level side chain 13 must be controlled to a high impedance by the lowering of the signal level of the recording input signal REC INPUT. In the case where the noise reduction system operates as the C-type encoder, both the variable impedance 33 of the high-level side chain 13 and the variable impedance 38 of the low-level side chain 15 must be controlled to high impedance by the lowering of the signal level of the recording input signal REC INPUT.

In the case where the noise reduction system operates as the B-type or C-type encoder, the bias oscillator 107 generates an A.C. bias signal of large voltage amplitude. As a result, A.C. bias signal components of unnegligible levels are induced in various parts of the noise reduction system by the capacitive couplings or inductive couplings between the output of the bias circuit 107 and the parts of the noise reduction system.

With regard to these induced A.C. bias signal components, an important aspect of the present invention is the inclusion of the bias trap circuits 102 and 112. If the bias trap circuits 102 and 112 are omitted from the noise reduction system of FIG. 6, unnegligible A.C. bias signal currents will flow through the frequency characteristic determining circuits 101 and 111 of the high level side chain 13 and the low-level side chain 15, respectively, even when the audio signal level of the recording input signal REC INPUT is low. Since such unnegligible A.C. bias signal currents flow through the frequency characteristic determining circuits 101 and 111, the output signals of the gain control amplifiers 35 and 40 increase undesirably. Accordingly, in spite of the small recording input signal REC INPUT, both the variable impedance 33 of the high-level side chain 13 and the variable impedance 38 of the low-level side chain 15 are undesirably controlled to low impedances by the induced A.C. bias signals.

As a result, in the case of omitting the bias trap circuits 102 and 112, although the noise reduction system operates as the B-type or C-type encoder, the actual encode characteristic of the system departs far from the ideal encode characteristic of each.

In contrast, in the noise reduction system according to the present invention, the bias trap circuits 102 and 112 are specifically arranged as illustrated in FIG. 6. Since the parallel resonance frequencies of the bias trap circuits 102 and 112 are set to be substantially equal to the frequency of the A.C. bias signal which is oscillated from the bias oscillator 107, the impedances of the bias trap circuits 102 and 112 become very large values at the frequency of the A.C. bias signal. Thus, the A.C. bias signal currents are prevented from flowing from the outputs of the gain control amplifiers 35 and 40 via the frequency characteristic determining circuits 101 and 111 to the bias trap circuits 102 and 112, respectively. Accordingly, if the recording input signal REC INPUT is small, the output signals of the gain control amplifiers 35 and 40 become low levels in proportion to the level of the recording input signal REC INPUT. Even when the noise reduction system of FIG. 6 operates as a B-type encoder or a C-type encoder, the encode characteristic thereof does not depart far from the ideal encode characteristic of each.

The noise reduction system conforming with the fundamental technical idea of the present invention is so constructed that the gain-frequency characteristic control sensitivity of the side chain 13 to the A.C. bias signal, which is supplied to the recording head 108 when the system operates as the encoder, becomes lower than the gain-frequency characteristic control sensitivity of the side chain 13 to the encoded input signal REC INPUT.

The present invention is not restricted to the foregoing embodiment, but it can adopt various modified aspects of performance on the basis of the fundamental technical idea thereof.

By way of example, the bias trap circuits 102 and 112 are not necessarily connected in series with the respective frequency characteristic determining circuits 101 and 102. Instead, if desired, they can be respectively connected between the output terminal of the signal amplifier 34 and the non-inverting input terminal ($\oplus$) of the gain control amplifier 35 and between the output terminal of the signal amplifier 39 and the non-inverting input terminal ($\oplus$) of the gain control amplifier 40. In this modified aspect of performance, however, the respective connections between the output terminals of the signal amplifiers 34 and 39 and the non-inverting input terminals of the gain control amplifiers 35 and 40 cannot be directly coupled within the IC. This is a somewhat disadvantageous problem in that it increases the number of the external connecting terminals of the IC by four.

In the case where the noise reduction system operates as a B-type or C-type decoder, the oscillation of the A.C. bias signal from the bias oscillator 107 is stopped. In this case, accordingly, the bias trap circuits 102 and 112 can be operationally omitted in such a way that switches which are respectively connected in parallel with the bias trap circuits 102 and 112 are controlled into their "on" states.

The present invention utilizing bias trap circuits is also applicable to a noise reduction system which is exclusively used for Dolby B-type or Dolby C-type systems.

The switching amplifiers 23, 24, 26, 27, 28, 29 and 30 can also be constructed of any suitable switching means including analog switches constructed of MOSFETs or the like.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A noise reduction system for use in a recording system which supplies an A.C. bias signal to a recording head during recording operations, said system comprising:

a first combining network which has first and second input terminals;

a first side chain having an output terminal which is connected to said second input terminal of said first combining network;

a first inverter having an input terminal which is connected to an output terminal of said first combining network;

first switching means for selectively supplying either an encode input signal or an output signal of said first inverter to an input terminal of said first chain;

means for supplying said encode input signal to said first input terminal of said first combining network when said encode input signal is supplied to said input terminal of said first side chain through said first switching means, so that an encode output signal is obtained from an output terminal of said first inverter;

means for supplying a decode input signal to said first input terminal of said combining network when said output signal of said first inverter is supplied to said input terminal of said first side chain through said first switching means, so that a decode output signal is obtained from said output terminal of said first inverter; and means for setting a gain-frequency characteristic control sensitivity of said first side chain to said A.C. bias signal at a value smaller than that of a gain-frequency characteristic control sensitivity of said first side chain to said encode input signal at least during periods when said output terminal of said first inverter provides an encoder output signal.

2. A noise reduction system according to claim 1, wherein said first side chain comprises:

a first variable impedance having an input which is connected to said input terminal of said first side chain;

a first signal amplifier having an input which is connected to an output of said first variable impedance;

a first gain control amplifier having a non-inverting input terminal which is connected to an output of said first signal amplifier and having an inverting input terminal which is connected to an output terminal of said first gain control amplifier;

a first frequency characteristic determining circuit and a first bias trap circuit which are connected in series between said inverting input terminal of said first gain control amplifier and a ground potential;

first rectifying diode means having an input which is connected to the output of said first gain control amplifier;

a first voltage-current converter having an input which is connected to an output of said first rectifying diode means and having an output which is connected to a control input of said first variable impedance; and a first overshoot suppressor having an input which is connected to said output of said first signal amplifier and having an output which is connected to said second input terminal of said first combining network.

3. A noise reduction system according to claim 2, wherein said setting means comprises said first bias trap circuit which has a parallel resonant frequency set at a value substantially equal to the frequency of said A.C. bias signal.

4. A noise reduction system according to claim 1, wherein said setting means comprises a bias trap circuit coupled in said first side chain and having a parallel resonant frequency set at a value substantially equal to a frequency of said A.C. bias signal.

5. A noise reduction system according to claim 3 or 4, wherein said bias trap circuit comprises an inductor and a capacitor in parallel with one another.

6. A noise reduction system according to claim 3 or 4, wherein said parallel resonant frequency is in a range of values between 60 kHz and 100 kHz.

* * * * *